US006826112B2

United States Patent
Ku et al.

(10) Patent No.: US 6,826,112 B2
(45) Date of Patent: Nov. 30, 2004

(54) LOW POWER LOGIC GATE (75) Inventors: Joseph Ku, Palo Alto, CA (US); James Robert Eaton, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 30 days.

(21) Appl. No.: 10/347,723

(22) Filed: Jan. 21, 2003

(65) Prior Publication Data

US 2004/0141400 A1 Jul. 22, 2004

(51) Int. Cl.[7] .................................................. G11C 8/00
(52) U.S. Cl. ............................ 365/230.06; 365/230.01; 365/242; 365/243
(58) Field of Search ................... 365/230.01, 230.06 O, 365/242, 243, 203, 94, 63

(56) References Cited

U.S. PATENT DOCUMENTS

| | | | | |
|---|---|---|---|---|
| 4,063,118 A | * | 12/1977 | Nishimura | ................... 326/106 |
| 4,513,399 A | * | 4/1985 | Tobita | ................... 365/189.06 |
| 4,547,868 A | * | 10/1985 | Childers et al. | ............ 365/203 |
| 6,496,440 B2 | | 12/2002 | Manning | |
| 6,504,746 B2 | * | 1/2003 | Ku | ............................... 365/94 |

* cited by examiner

Primary Examiner—Van Thu Nguyen
(74) Attorney, Agent, or Firm—Brian R. Short (57) ABSTRACT

The invention includes a logic gate. The logic gate includes a charge holding device. A charging circuit selectively provides a predetermined charge for the charge holding device. A logic gate output is a function of charge on the charge holding device. The logic gate further includes a plurality of inputs. The plurality of inputs are electrically connected to the charge holding device so that the charge of the charge holding device is modified if any of the plurality of inputs is a first voltage potential. The invention also includes an address decoder. The address decoder includes a charge holding device. A charging circuit selectively provides a predetermined charge for the charge holding device. An address decoder output is a function of charge on the charge holding device. The address decoder further includes a plurality of address lines. The plurality of address lines are electrically connected to the charge holding device so that the charge of the charge holding device is modified if any of the plurality of address lines is a first voltage potential.

28 Claims, 10 Drawing Sheets

LOW POWER LOGIC GATE

RELATED APPLICATIONS

The present invention is related to concurrently filed, commonly assigned, application Ser. No. 10/348,645, entitled A Method and Apparatus for Selecting Memory Cells within a Memory Array.

FIELD OF THE INVENTION

The invention relates generally to digital logic. More particularly, the invention relates to a low power logic gate that is adaptable for use in memory address decoding.

BACKGROUND OF THE INVENTION

Computing devices require memory. The memory can include read only memory (ROM) or random access memory (RAM). Generally, memory includes memory cells that are arranged in rows and columns. The individual memory cells are accessed through the use of row select lines and column select lines, typically referred to as word lines and bit lines.

Typically, a computing device accesses data stored in the memory cells of memory through address lines. Each memory cell has a particular address, which allows the computing device to access data stored within each memory cell.

An address decoder receives the address lines, and provides for selection of the proper word line and bit line based upon an address received by the address decoder. As previously described, the word lines and bit lines provide for selection of the memory cells.

Figure 1:
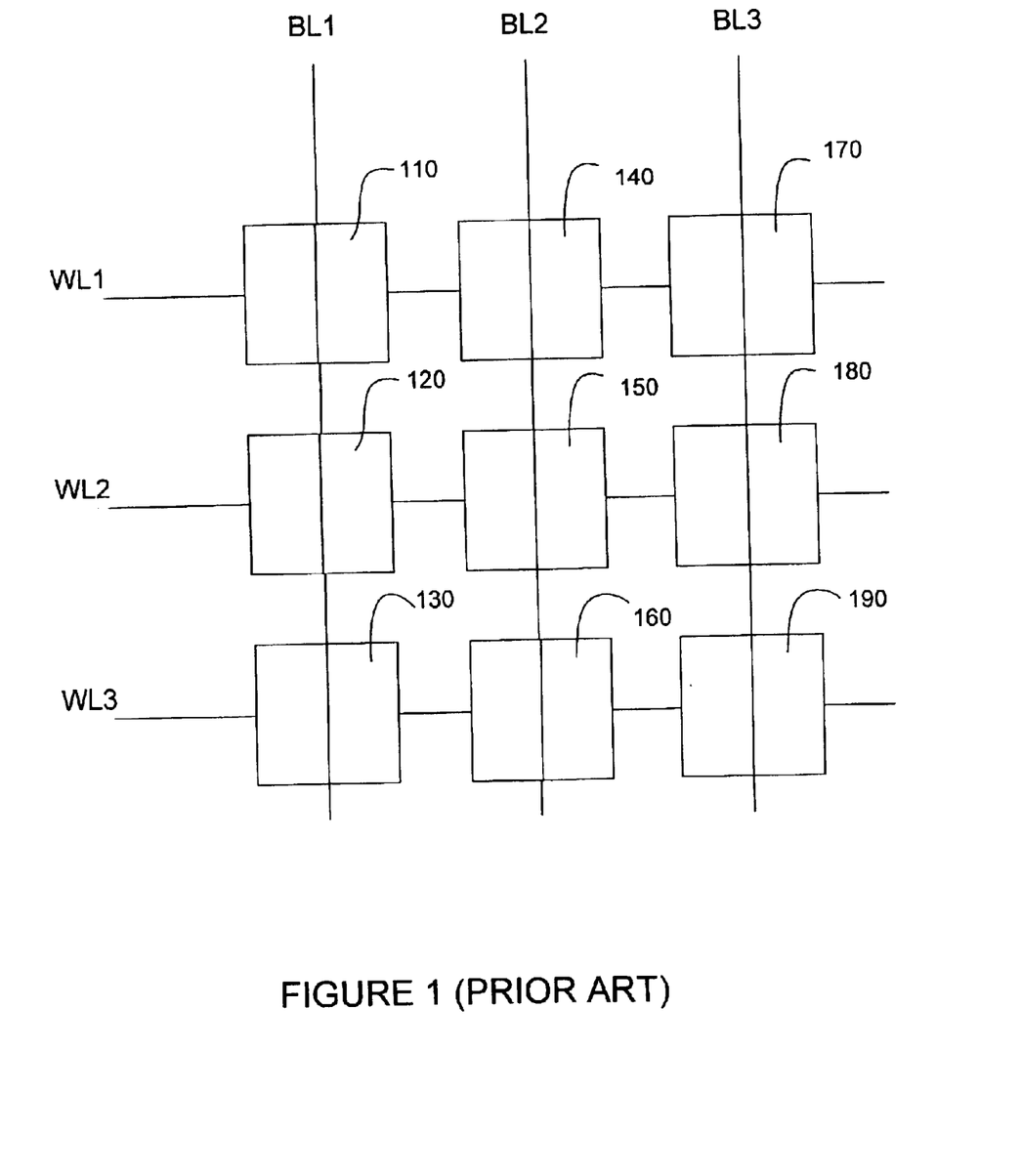
FIG. 1 shows an array of memory cells.

ROM devices generally include an array of memory cells. The memory cells are typically configured in rows and columns. Each row generally includes a corresponding word line, and each column generally includes a corresponding bit line. FIG. 1 shows an ROM array of memory cells 110, 120, 130, 140, 150, 160, 170, 180, 190 and corresponding word lines (WL) and bit lines (BL). The ROM memory cells 110–190 are located at cross-points of the word lines and the bit lines, and each ROM memory cells 110–190 generally stores a bit of information.

The ROM memory cells 110–190 include functionality for setting the ROM memory cells 110–190 to one of at least two logical states. Each logical state represents a bit of information. Additionally, the ROM memory cells 110–190 include functionality for sensing the logical state of each of the ROM memory cells 110–190.

The logical state of a ROM cell can be set according to fuse, or anti-fuse ROM technology. A first state of a ROM cell can include a diode connection between the word line and the bit line selecting the ROM cell. A second state of a ROM cell can include an "open circuit" connection (that is, the lack of a connection) between the word line and the bit line selecting the ROM cell. Both of these states are generally easy to detect.

Figure 2:
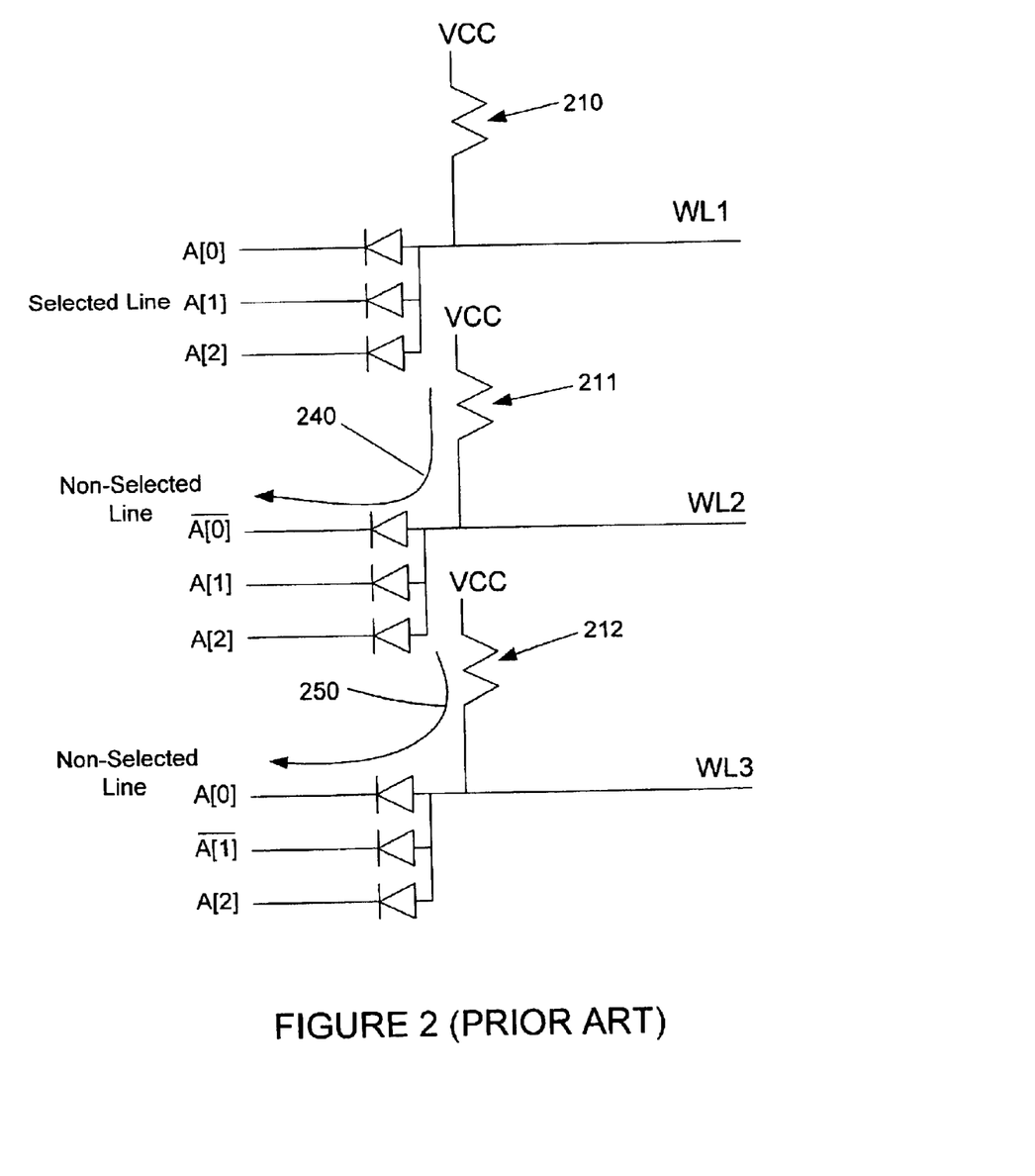
FIG. 2 shows address decoder logic of a typical memory array.

FIG. 2 shows logic gates included within a typical address decoder. The address decoder includes conventional diode-resistor logic (DRL) decoding. The decoder receives address lines A[0], A[1], A[2] and selects a corresponding word line WL1, WL2, WL3. Each word line includes a resistor 210, 211, 212 that is connected to a supply voltage potential. If any one of the address line inputs is at a low voltage potential, then the corresponding word line WL1, WL2, WL3 is pulled down to a low voltage potential (not selected) through the corresponding resistor 210, 211, 212, and a corresponding series diode. A word line is selected if all of corresponding address lines are at a high voltage potential, and the corresponding resistor 210, 211, 212 does not conduct current because none of the corresponding series diodes are conducting current.

Arrows 240, 250 depict current flow through the logic gates of non-selected word lines. It can be observed from FIG. 2 that the only pull up resistor 210, 211, 212 of the address decoder that does not conduct current is the pull up resistor 210 that corresponds to the selected word line. This can be problematic for large arrays of memory cells because large arrays of memory cells require many word lines. Since all of the word lines except the selected word line include a pull up resistor conducting current, a memory cell array including a large amount of word lines dissipates large amounts of power.

It is desirable to have an apparatus and method for a logic gate that consumes small amounts of power. It is desirable that the logic gate be adaptable for incorporation into memory address decoders. Particularly, memory address decoders of large memory arrays.

SUMMARY OF THE INVENTION

The invention includes an apparatus and method for a logic gate that consumes small amounts of power. The logic gate is adaptable for incorporation into memory address decoders.

A first embodiment of the invention includes a logic gate. The logic gate includes a charge holding device. A charging circuit selectively provides a predetermined charge for the charge holding device. A logic gate output is a function of charge on the charge holding device. The logic gate further includes a plurality of inputs. The plurality of inputs are electrically connected to the charge holding device so that the charge of the charge holding device is modified if any of the plurality of inputs is a first voltage potential.

Another embodiment of the invention includes an address decoder. The address decoder includes a charge holding device. A charging circuit selectively provides a predetermined charge for the charge holding device. An address decoder output is a function of charge on the charge holding device. The address decoder further includes a plurality of address lines. The plurality of address lines are electrically connected to the charge holding device so that the charge of the charge holding device is modified if any of the plurality of address lines is a first voltage potential.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in a low power logic gate that is adaptable for use within a memory address decoder. The memory address decoder provides selection of address lines within an array of memory cells.

For processing reasons, it can be desirable to manufacture read only memory (ROM) integrated circuits so that active devices such as transistors of the ROM are processed separately from passive devices of the ROM such as resistors, diodes, capacitors and inductors. This can be accomplished by manufacturing the ROM as multiple integrated circuits in which active devices are manufactured as an integrated circuit that is separate from a passive devices integrated circuit.

ROM that includes the previously described diode memory elements can be manufactured with the memory elements on an integrated circuit that is separate from the active devices of the ROM. In such an arrangement, it can be advantageous to include the address decoders on the same integrated circuit as the memory elements, because of the possibility of a large number of word lines and bit lines to select the memory elements. Therefore, the address decoders should include passive devices rather than active devices. Diode-resistor logic can be included within passive device address decoders.

Figure 3:
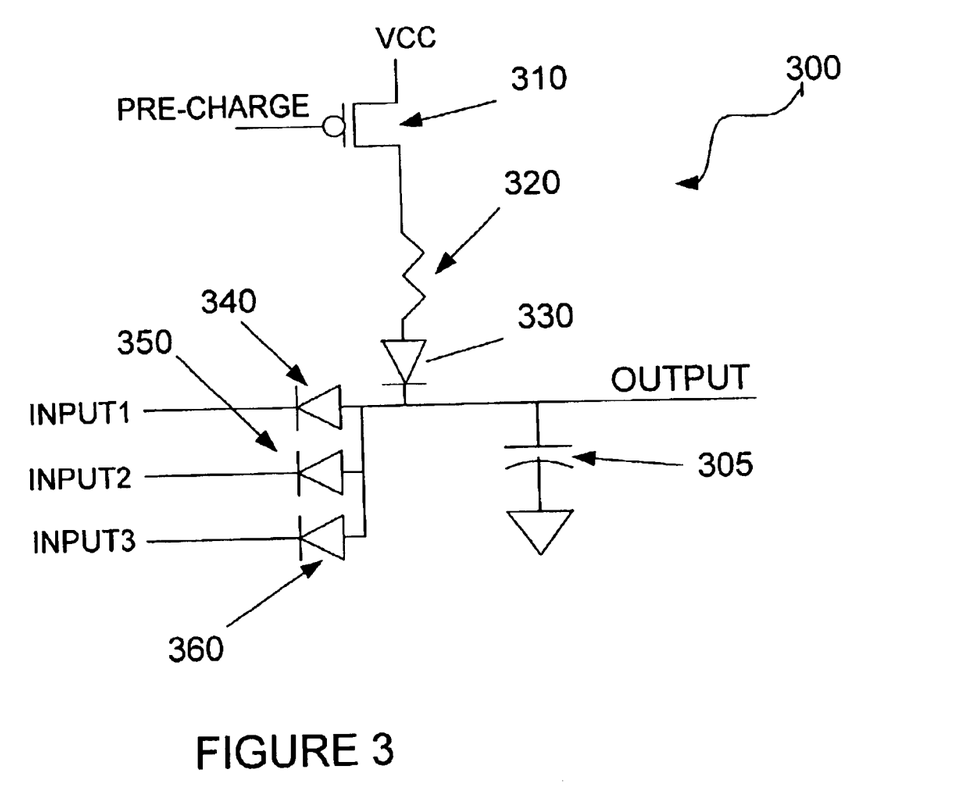
FIG. 3 shows a logic gate according to an embodiment of the invention.

FIG. 3 shows a logic gate 300 according to an embodiment of the invention. Generally, the logic gate 300 of FIG. 3 functions as an AND gate.

Generally, the logic gate 300 includes a charge holding device 305. A charging circuit selectively provides a charge for the charge holding device 305. A logic gate output (OUTPUT) is provided that is a function of charge on the charge holding device 305. A plurality of inputs (INPUT1, INPUT2 . . . INPUTN) are electrically connected to the charge holding device 305 so that the charge of the charge holding device 305 is modified if any one of the plurality of inputs (INPUT1, INPUT2 . . . INPUTN) is below a first voltage potential (for example, VCC–VD), where VD is a voltage potential drop across a forward biased series charging diode. FIG. 3 only includes three inputs, but it is to be understood that the logic gate 300 can receive any number of inputs.

The charge holding device of FIG. 3 can be a charging capacitor 305. For the embodiment of FIG. 3, the charging of the capacitor 305 is initiated by a pre-charge line (PRE-CHARGE) that turns on a charging transistor 310. When the charging transistor 310 is turned on, a power supply voltage VCC is electrically connected to the charging capacitor 305 through a series resistor 320 and a series charging diode 330.

Generally, the charging capacitor 305 is charged until a voltage potential across the charging capacitor 305 is approximately VCC–VD, where VD is a voltage potential drop across the forward biased series charging diode 330. The pre-charge is timed. That is, the charging transistor 310 is turned off after the charging capacitor 305 has been fully charged.

The charge of the charging capacitor 300 remains on the charging capacitor 300 until any of the inputs (INPUT1, INPUT2 . . . INPUTN) include a voltage potential below a voltage potential required to turn on a corresponding logic diode 340, 350, 360. If any of the logic diodes 340, 350, 360 turn on, charge on the charging capacitor will be modified. Unlike the prior art, this embodiment includes a reversed bias diode (the series charging diode 330) in series with a pull up resistor (the series resistor 320). Therefore, this logic gate only dissipates transient power.

The charging circuit can include the charging transistor 310. The charging transistor is an active device that can be located on a first substrate. The rest of the logic gate 310, and circuitry that the output (OUTPUT) is connected, can be located on a second substrate. This provides the advantage of isolating active devices of one substrate, from passive devices of another substrate. As will be described later, a single charging transistor can be connected to multiple logic gates.

Figure 4:
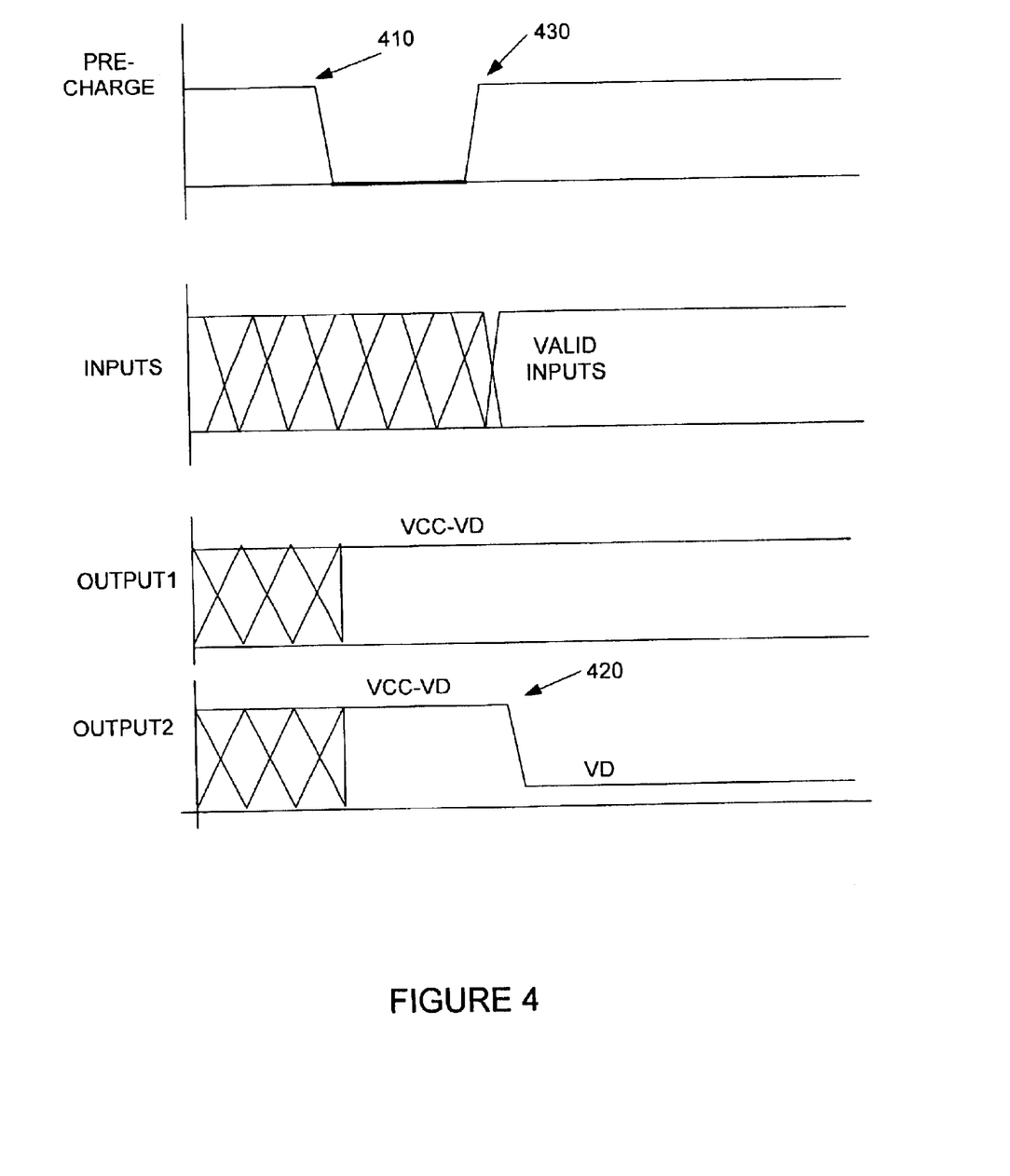
FIG. 4 shows waveforms representing voltage potentials of various points of the logic gate of FIG. 3.

FIG. 4 shows waveforms of voltage potentials of the logic gate of FIG. 3 during operation. The pre-charge line (PRE-CHARGE) is initially high, turning off the charging transistor 310 (transistor 310 is shown as a p-channel transistor), which causes the charging capacitor to include an unknown amount of charge.

FIG. 4 includes an OUTPUT1, and an OUTPUT2. OUTPUT1 represents the OUPUT of the logic gate of FIG. 3 when all inputs to the logic gate are at a high voltage potential. OUTPUT 2 represents the OUTPUT of the logic gate of FIG. 3 when at least one of the inputs to the logic gate is at low voltage potential.

Initially, the pre-charge line (PRE-CHARGE) is at a high voltage potential. This corresponds with the charging transistor 310 being "turned off" or not conducting. Initially, both OUTPUT1 and OUTPUT2 are at undefined voltage potentials (as indicated by the cross-hatching on FIG. 4).

When the pre-charge line (PRE-CHARGE) transitions to a low voltage potential at point 410, the outputs (OUTPUT1, OUTPUT2) initially transition to high voltage potentials (VCC–VD) as the capacitor 305 is pre-charged because the charging transistor 310 is "turned on." The outputs (OUTPUT1, OUTPUT2) remain at the high voltage potentials while the pre-charge line (PRE-CHARGE) remains at the low voltage potential When the pre-charge line transitions to a high voltage potential at point 430, the charging transistor 310 is again "turned off." At this point, the voltage potentials of the outputs (OUTPUT1, OUTPUT2) operate differently. The voltage potentials of the outputs (OUTPUT1, OUTPUT2) become dependent upon the voltage potentials of the inputs (INPUT1, INPUT2, INPUT3).

OUTPUT1 depicts that the output of the logic gate remains high if all of the inputs are at a high voltage potential, and all of the corresponding input diodes 340, 350, 360 do not conduct current.

OUTPUT2 depicts that the output of the logic gate transitions to a low voltage potential if any of the inputs to the logic gate are at a low voltage potential. The low voltage potential is approximately equal to VD if the input voltage potentials are approximately zero. The transition is shown at point 420.

Figure 5:
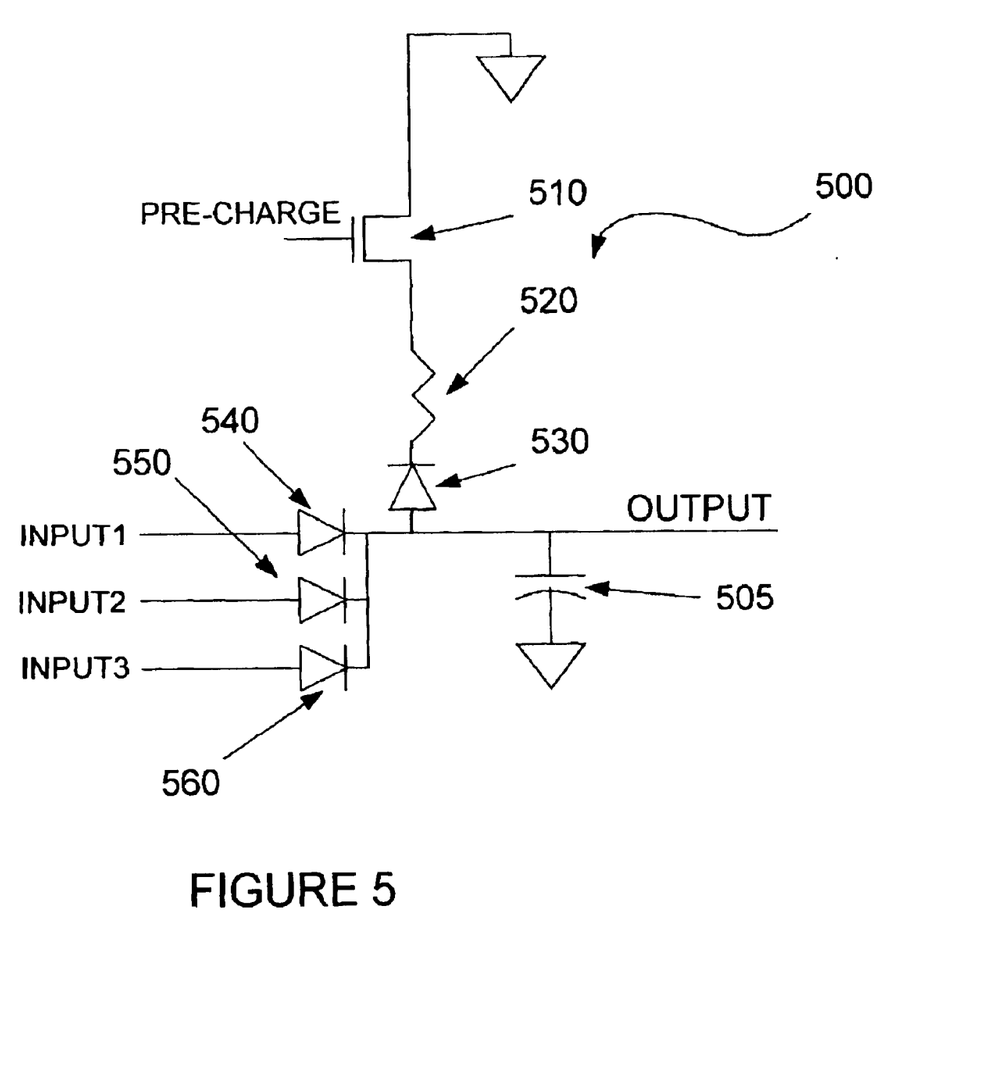
FIG. 5 shows a logic gate according to another embodiment of the invention.

FIG. 5 shows a logic gate 500 according to another embodiment of the invention. Generally, the logic gate 500 of FIG. 5 functions as an OR gate.

Generally, the logic gate 500 includes a charge holding device 505. A charging circuit selectively provides a charge for the charge holding device 505. A logic gate output (OUTPUT) is provided that is a function of charge on the charge holding device 505. A plurality of inputs (INPUT1, INPUT2 . . . INPUTN) are electrically connected to the charge holding device 505 so that the charge of the charge holding device 505 is modified if any of the plurality of inputs (INPUT1, INPUT2 . . . INPUTN) is above a first voltage potential (for example, VD). FIG. 5 only includes three inputs, but it is to be understood that the logic gate 500 can receive any number of inputs.

Initially, the charging capacitor 505 of the logic gate 500 is discharged through a discharge transistor 510, a discharge diode 530 and a discharge resistor 520. When the pre-charge line (PRE-CHARGE) is at a high voltage potential, the discharge transistor 510 is turned on which provides a discharge path for any charge on the charging capacitor 505. After discharge, the charging capacitor 505 generally holds a charge such that the voltage potential of the charging capacitor 505 is VD, where VD is the voltage drop across the discharge diode 530.

If any of the inputs (INPUT1, INPUT2, INPUT3) are at a high voltage potential, then the charging capacitor charges to a high voltage potential through one of the series input diodes 540, 550, 560. If the any of the inputs are at a voltage potential of VCC, the charging capacitor charges to VCC-VD.

Unlike the prior art, this embodiment includes input diodes that prevent current flow if the voltage potential across the input diodes is less than a diode turn on voltage potential VD (typically 0.6 Volts in Silicon). Therefore, this logic gate only dissipates transient power.

Figure 6:
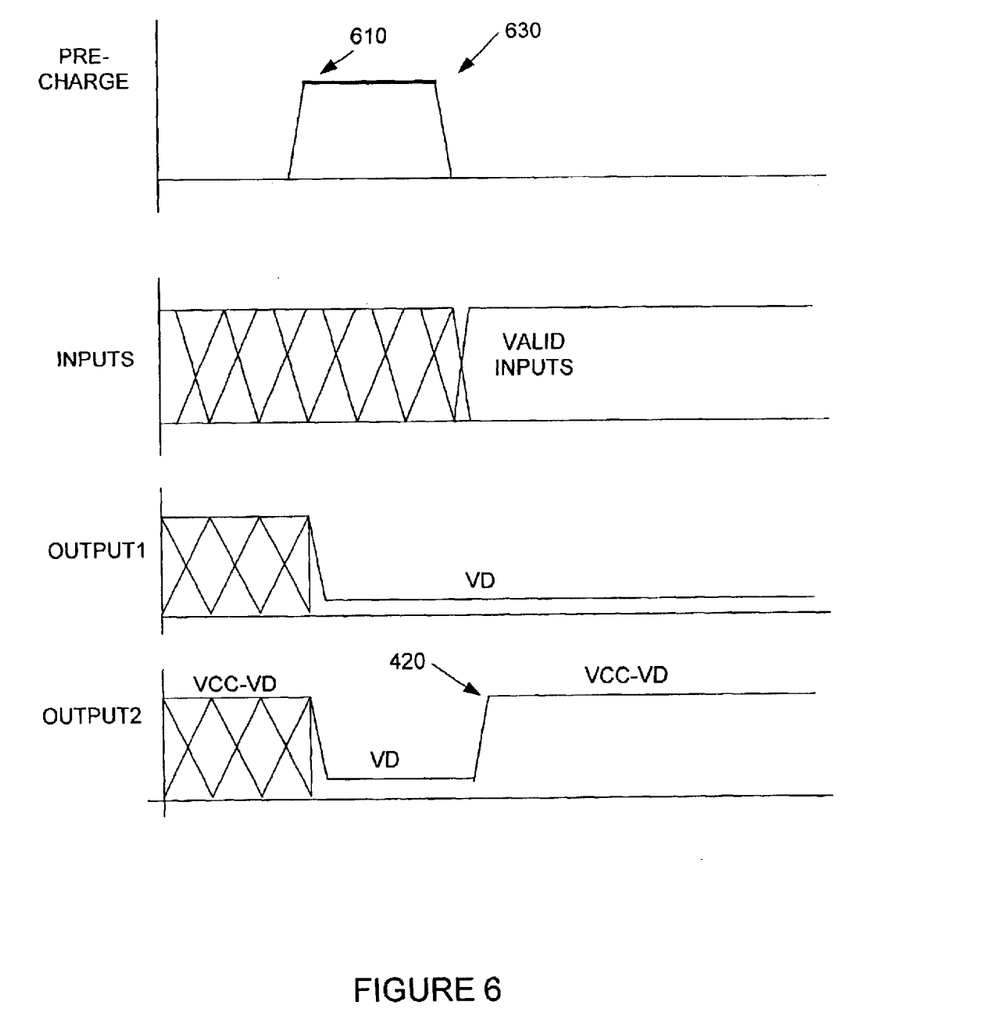
FIG. 6 shows waveforms representing voltage potentials of various points of the logic gate of FIG. 5.

FIG. 6 shows waveforms representing voltage potentials of various points of the logic gate of FIG. 5. The pre-charge line (PRE-CHARGE) is initially low, and the charging capacitor includes an undetermined amount of charge.

FIG. 6 includes an OUTPUT1, and an OUTPUT2. OUTPUT1 represents the OUPUT of the logic gate of FIG. 5 when all inputs to the logic gate are at a low voltage potential. OUTPUT 2 represents the OUTPUT of the logic gate of FIG. 5 when at least one of the inputs to the logic gate are at high voltage potential.

Initially, the pre-charge line (PRE-CHARGE) is at a low voltage potential. This corresponds with the charging transistor 510 being "turned off" or not conducting. Both OUTPUT1 and OUTPUT2 are at undefined voltage potentials (as indicated by the cross-hatching on FIG. 6).

When the pre-charge line (PRE-CHARGE) transitions to a high voltage potential at point 610, the outputs (OUTPUT1, OUTPUT2) initially transition to low voltage potentials (VD) as the capacitor 305 is dis-charged because the charging transistor 310 is "turned on." The outputs (OUTPUT1, OUTPUT2) remain at the low voltage potentials while the pre-charge line (PRE-CHARGE) remains at the high voltage potential When the pre-charge line transitions to a low voltage potential at point 630, the charging transistor 510 is again "turned off." At this point, the voltage potentials of the outputs (OUTPUT1, OUTPUT2) operate differently. The voltage potentials of the outputs (OUTPUT1, OUTPUT2) become dependent upon the voltage potentials of the inputs (INPUT1, INPUT2, INPUT3).

OUTPUT1 depicts that the output of the logic gate remains low if all of the inputs are at a low voltage potential, and all of the corresponding input diodes 340, 350, 360 do not conduct current.

OUTPUT2 depicts that the output of the logic gate transitions to a high voltage potential if any of the inputs to the logic gate are at a low voltage potential. The high voltage potential is approximately equal to VCC-VD if any of the input voltage potentials are at a high voltage potential. The transition is shown at point 420.

Figure 7:
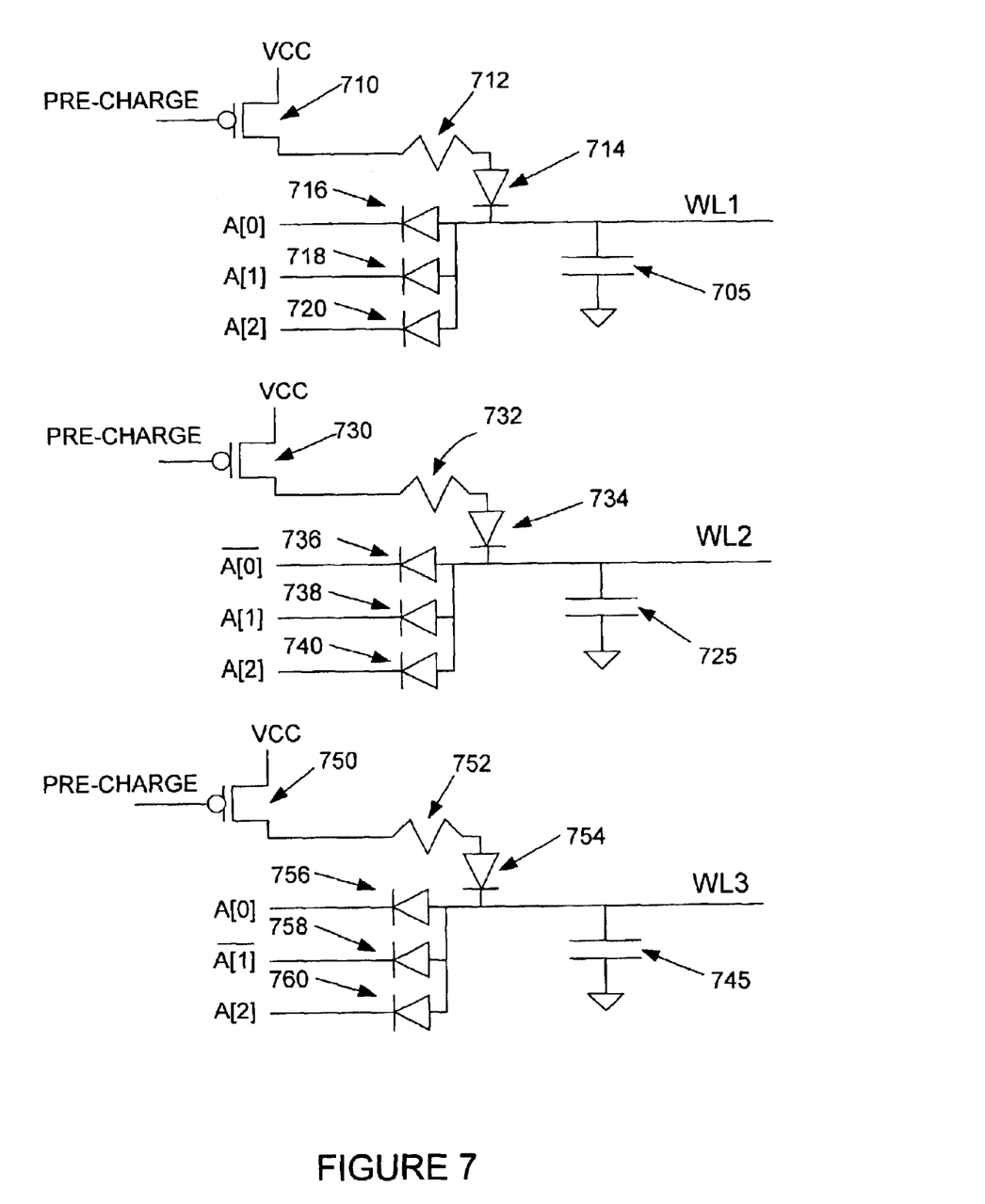
FIG. 7 shows an address decoder according to an embodiment of the invention.

FIG. 7 shows an address decoder according to an embodiment of the invention. Generally, the address decoder includes many of the logic gates of FIG. 3. Each logic gate is associated with a corresponding word line WL1, WL2, WL3. FIG. 7 only includes three word lines. However, more word lines can be included.

Generally, only one word line will include a high voltage potential at a time. The word line having the high voltage potential corresponds to the memory cell being selected. All of the other word lines include a low voltage potential. Unlike the prior art, this embodiment does not include a pull up resistor. Therefore, this logic gate only dissipates transient power.

A first address decoder logic gate provides for selection of the first word line WL1. The first word line WL1 is selected if all of the address lines A[0], A[1], A[2] are at a high voltage potential.

As with the previously described logic gates, word line selection begins by charging a charging capacitor 705. The charging capacitor 705 is charged by selecting (applying a voltage potential great enough to turn on charging transistor 710) the PRE-CHARGE line. Selecting the PRE_CHARGE line causes the charging capacitor 705 to accumulate charge as current flows through the charging transistor 710, the charging resistor 712 and the charging diode 714.

After the charging capacitor 705 has been charged, the PRE-CHARGE line can be deselected, allowing for selection of a word line. Generally, the charging capacitor 705 is charged to a voltage potential of VCC-VD.

The first word line WL1 is selected if all of address lines A[0], A[1], A[2] are at a high enough voltage potential that none of series input diodes 716, 718, 720 are turned on. That is, none of the series input diodes 716, 718, 720 conduct any current. Therefore, the charging capacitor 705 retains all of its charge, and the first word line WL1 is selected.

If any of the address lines A[0], A[1], A[2] have a voltage potential a diode voltage drop lower than the voltage potential of the charging capacitor 705, the corresponding series input diode 716, 718, 720 will conduct current, and the charging capacitor 705 will discharge through the corresponding series input diodes 716, 718, 720. This corresponds with the word line WL1 not being selected.

A second address decoder logic gate provides for selection of the second word line WL2. The second word line WL2 is selected if all of the address lines A[0] (inverted), A[1], A[2] are at a high voltage potential.

As with the previously described logic gates, word line selection begins by charging a charging capacitor 725. The charging capacitor 725 is charged by selecting (applying a voltage potential to turn on charging transistor 730) the PRE-CHARGE line. Selecting the PRE_CHARGE line causes the charging capacitor 725 to accumulate charge as current flows through the charging transistor 730, the charging resistor 732 and the charging diode 734.

The second word line WL2 is selected if all of address lines A[0] (inverted), A[1], A[2] are at a high enough voltage potential that none of series input diodes 736, 738, 730 are turned on. That is, none of the series input diodes 736, 738, 730 conduct any current. Therefore, the charging capacitor 725 retains all of its charge, and the second word line WL2 is selected.

If any of the address lines A[0] (inverted), A[1], A[2] have a voltage potential a diode voltage drop lower than the voltage potential of the charging capacitor 725, the corresponding series input diodes 736, 738, 730 will conduct current, and the charging capacitor 725 will discharge through the corresponding series input diodes 736, 738, 730. This corresponds with the word line WL2 not being selected.

A third address decoder logic gate provides for selection of the third word line WL3. The third word line WL3 is selected if all of the address lines A[0], A[1] (inverted), A[2] are at a high voltage potential.

As with the previously described logic gates, word line selection begins by charging a charging capacitor 745. The charging capacitor 745 is charged by selecting (applying a voltage potential great enough to turn on charging transistor 750) the PRE-CHARGE line. Selecting the PRE_CHARGE line causes the charging capacitor 745 to accumulate charge as current flows through the charging transistor 750, the charging resistor 752 and the charging diode 754.

The third word line WL3 is selected if all of address lines A[0], A[1] (inverted), A[2] are at a high enough voltage potential that none of series input diodes 756, 758, 750 are turned on. That is, none of the series input diodes 756, 758, 750 conduct any current. Therefore, the charging capacitor 745 retains all of its charge, and the third word line WL3 is selected.

If any of the address lines A[0], A[1] (inverted), A[2] have a voltage potential a diode voltage drop lower than the voltage potential of the charging capacitor 745, the corresponding series input diode 756, 758, 750 will conduct current, and the charging capacitor 745 will discharge through the corresponding series input diodes 756, 758, 750. This corresponds with the word line WL3 not being selected.

The charging diodes 714, 734, 754 provide isolation between the selected word line and all of the non-selected word lines, after a word line selection has been made.

FIG. 7 shows the charging transistors 710, 730, 750 as separate transistors. Generally, however, the charging transistors 710, 730, 750 are actually a single transistor that provides pre-charging of all of the charging capacitors at the same time. A benefit of this configuration is that a single off-substrate transistor (such as the described charging transistors) can be used to pull up an entire ROM decoder fabricated on a passive device substrate. A charging diode isolates a selected line from being discharged by the unselected lines.

Figure 8:
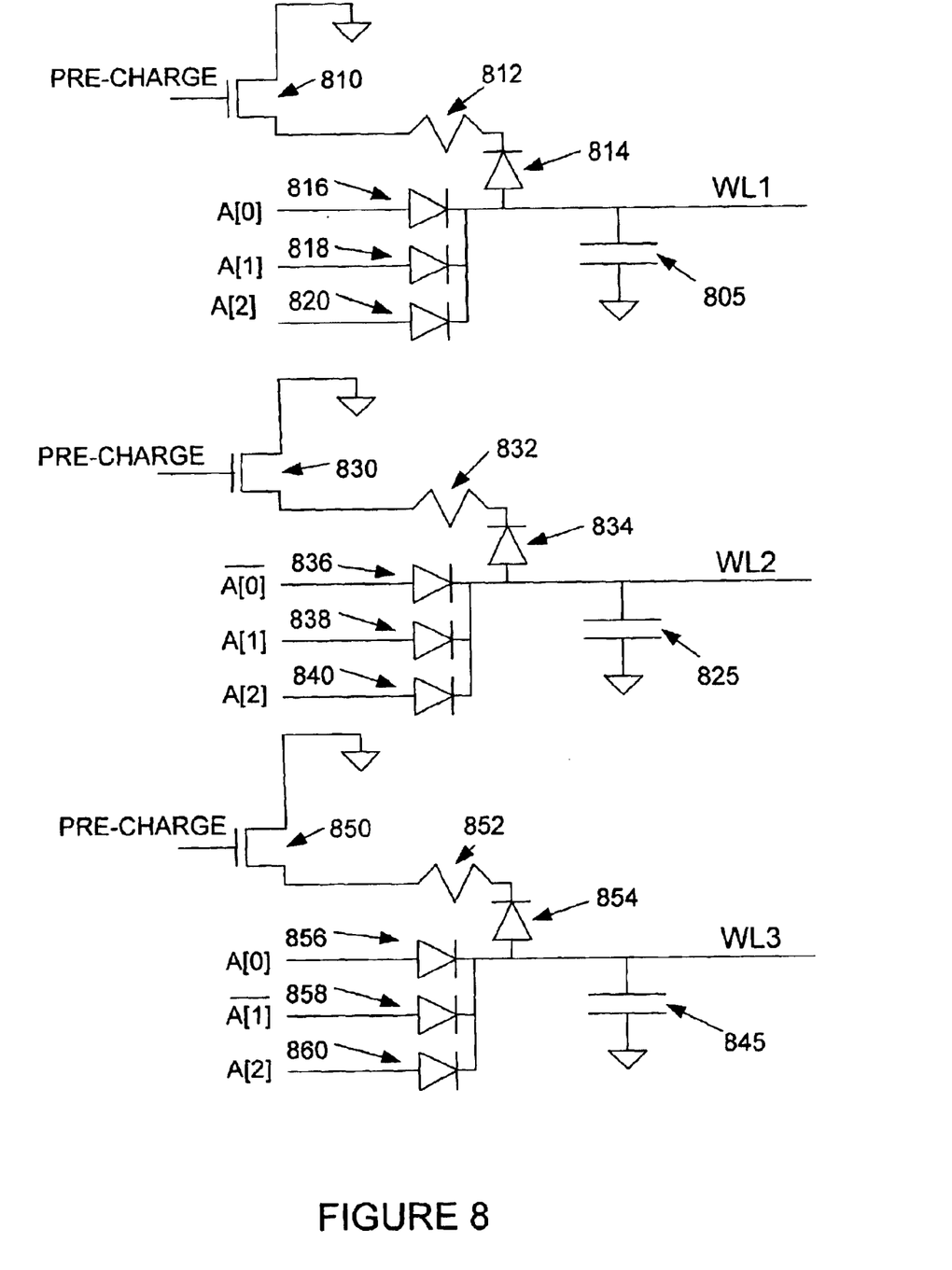
FIG. 8 shows an address decoder according to another embodiment of the invention.

FIG. 8 shows address decoder according to another embodiment of the invention. Generally, the address decoder includes many of the logic gates of FIG. 5. Each logic gate is associated with a corresponding word line.

Each logic gate is associated with a corresponding word line WL1, WL2, WL3. FIG. 8 only includes three word lines. However, more word lines can be included.

Generally, only one word line will include a low voltage potential at a time. The word line having the low voltage potential corresponds to the memory cell being selected. All of the other word lines include a high voltage potential. Unlike the prior art, this embodiment does not include a pull up resistor. Therefore, this logic gate only dissipates transient power.

A first address decoder logic gate provides for selection of the first word line WL1. The first word line WL1 is selected if all of the address lines A[0], A[1], A[2] are at a low voltage potential.

As with the previously described logic gates, word line selection begins by dis-charging a charging capacitor 805. The charging capacitor 805 is dis-charged by selecting (applying a voltage potential great enough to turn on charging transistor 810) the PRE-CHARGE line. Selecting the PRE_CHARGE line causes the charging capacitor 805 to discharge as current flows through the charging transistor 810, the charging resistor 812 and the charging diode 814.

After the charging capacitor 805 has been dis-charged, the PRE-CHARGE line can be deselected, allowing for selection of a word line. Generally, the charging capacitor 805 is charged to a voltage potential of VD.

The first word line WL1 is selected if all of address lines A[0], A[1], A[2] are at a low enough voltage potential that none of series input diodes 816, 818, 820 are turned on. That is, none of the series input diodes 816, 818, 820 conduct any current. Therefore, the charging capacitor 805 retains all of its charge, and the first word line WL1 is selected.

If any of the address lines A[0], A[1], A[2] have a voltage potential a diode voltage drop greater than the voltage potential of the charging capacitor 805, the corresponding series input diode 816, 818, 820 will conduct current, and the charging capacitor 805 will charge through the corresponding series input diodes 816, 818, 820. This corresponds with the word line WL1 not being selected.

A second address decoder logic gate provides for selection of the second word line WL2. The second word line WL2 is selected if all of the address lines A[0] (inverted), A[1], A[2] are at a low voltage potential.

As with the previously described logic gates, word line selection begins by dis-charging a charging capacitor 825. The charging capacitor 825 is dis-charged by selecting (applying a voltage potential great enough to turn on charging transistor 830) the PRE-CHARGE line. Selecting the PRE_CHARGE line causes the charging capacitor 825 to dis-charge as current flows through the charging transistor 830, the charging resistor 832 and the charging diode 834.

The second word line WL2 is selected if all of address lines A[0] (inverted), A[1], A[2] are at a low enough voltage potential that none of series input diodes 836, 838, 830 are turned on. That is, none of the series input diodes 836, 838, 830 conduct any current. Therefore, the charging capacitor 825 retains all of its charge, and the second word line WL2 is selected.

If any of the address lines A[0] (inverted), A[1], A[2] have a voltage potential a diode voltage drop greater than the voltage potential of the charging capacitor 825, the corresponding series input diode 836, 838, 830 will conduct current, and the charging capacitor 825 will charge through the corresponding series input diodes 836, 838, 830. This corresponds with the word line WL2 not being selected.

A third address decoder logic gate provides for selection of the third word line WL3. The third word line WL3 is selected if all of the address lines A[0], A[1] (inverted), A[2] are at a low voltage potential.

As with the previously described logic gates, word line selection begins by dis-charging a charging capacitor 845. The charging capacitor 845 is dis-charged by selecting (applying a voltage potential great enough to turn on charging transistor 850) the PRE-CHARGE line. Selecting the PRE_CHARGE line causes the charging capacitor 845 to accumulate charge as current flows through the charging transistor 850, the charging resistor 852 and the charging diode 854.

The third word line WL3 is selected if all of address lines A[0], A[1] (inverted), A[2] are at a low enough voltage potential that none of series input diodes 856, 858, 850 are turned on. That is, none of the series input diodes 856, 858, 850 conduct any current. Therefore, the charging capacitor 845 retains all of its charge, and the third word line WL3 is selected.

If any of the address lines A[0], A[1] (inverted), A[2] have a voltage potential a diode voltage drop greater than the voltage potential of the charging capacitor 845, the corresponding series input diode 856, 858, 850 will conduct current, and the charging capacitor 845 will discharge through the corresponding series input diodes 856, 858, 850. This corresponds with the word line WL3 not being selected.

The charging diodes 814, 834, 854 provide isolation between the selected word line and all of the non-selected word lines, after a word line selection has been made.

FIG. 8 shows the charging transistors 810, 830, 850 as separate transistors. Generally, however, the charging transistors 810, 830, 850 are actually a single transistor that provides pre-charging of all of the charging capacitors at the same time. A benefit of this configuration is that a single off-substrate transistor (such as the described charging transistors) can be used to pull up an entire ROM decoder fabricated on a passive device substrate. A charging diode isolates a selected line from being discharged by the unselected lines.

Figure 9:
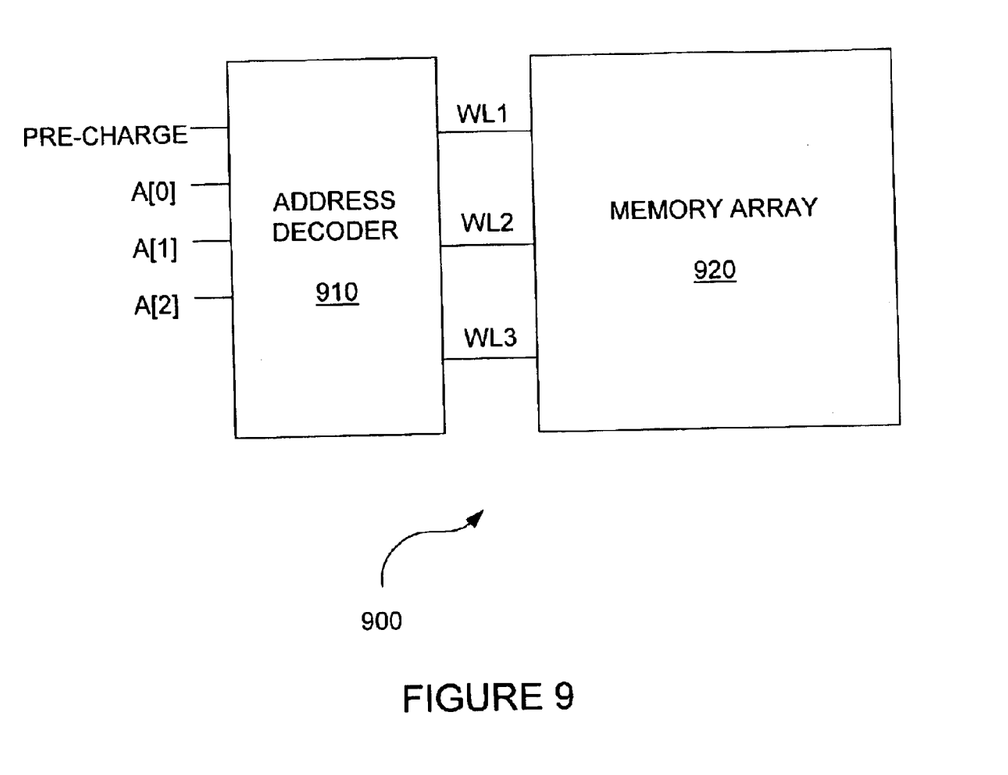
FIG. 9 shows a memory array according to an embodiment of the invention.

FIG. 9 shows a memory system 900 according to an embodiment of the invention. The memory system includes a memory array 920 that includes rows and columns of memory cells. The memory cells of the memory array 920 are selected through an address decoder 910. The address decoder 910 can include an embodiment of the address decoders of FIG. 7 or FIG. 8.

Figure 10:
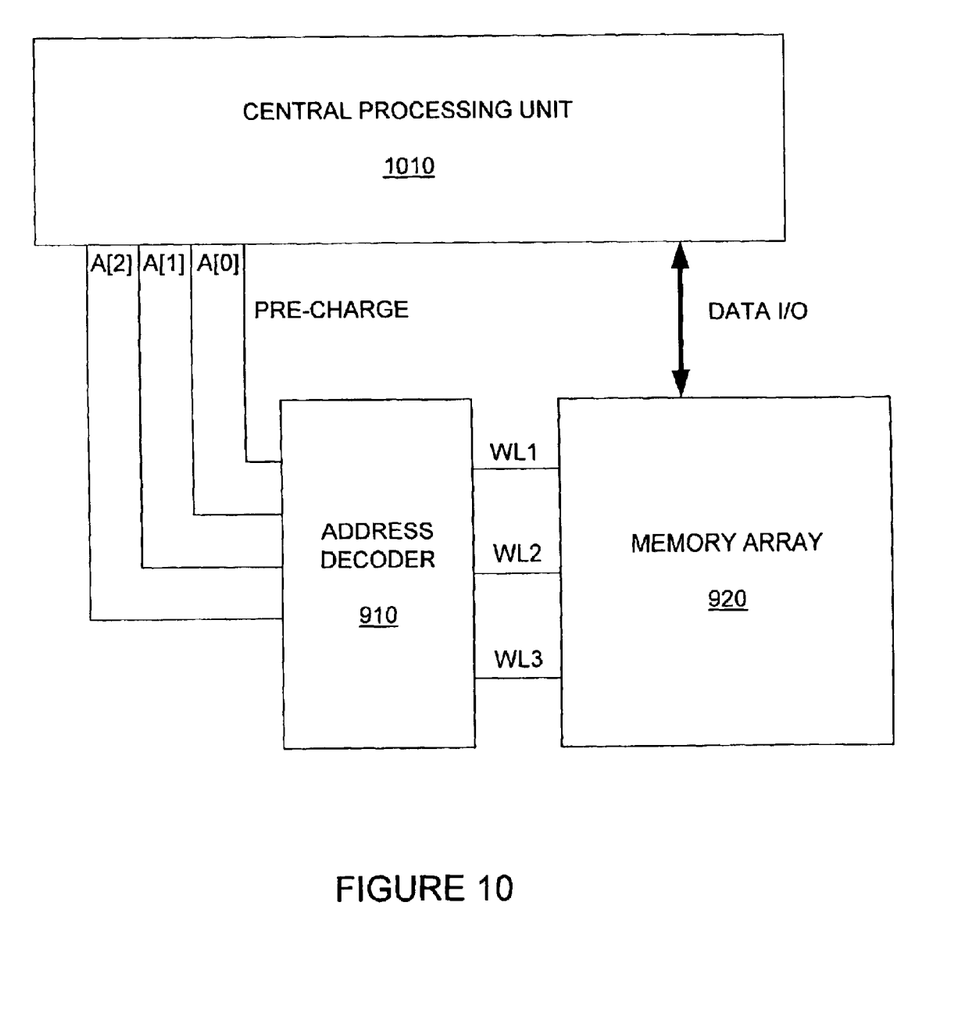
FIG. 10 shows a computing system according to an embodiment of the invention.

FIG. 10 shows a computing system according to an embodiment of the invention. Generally, the computing system includes a central processing unit (CPU) 1010 and associated memory system. The memory system can include the memory address decoder 1010, and memory array 920 of FIG. 9.

Although specific embodiments of the invention have been described and illustrated, the invention is not to be limited to the specific forms or arrangements of parts so described and illustrated. The invention is limited only by the appended claims.

What is claimed:

1. A logic gate comprising:
   a charge holding device;
   a charging circuit for selectively providing a predetermined charge for the charge holding device, the charging circuit comprising an electrically switched connection of a predetermined voltage potential to the charge holding device through a series diode;
   a logic gate output that is a function of charge on the charge holding device; and
   a plurality of inputs, the plurality of inputs electrically connected to the charge holding device so that the charge of the charge holding device is modified if any of the plurality of inputs is a first voltage potential.

2. The logic gate of claim 1, wherein the charging circuit comprises a charging transistor.

3. The logic gate of claim 2, wherein the charging transistor is located on a first substrate, and the charge holding device and the logic gate output are located on a second substrate.

4. The logic gate of claim 1, wherein the charge of the charge holding device is not modified if all of the plurality of inputs are at a second voltage potential.

5. The logic gate of claim 1, wherein the charge holding device comprises a capacitor.

6. The logic gate of claim 1, wherein each of the plurality of inputs is electrically connected to the charge holding device through a corresponding series diode.

7. The logic gate of claim 1, wherein the charge holding device is a capacitor, and the charging circuit provides a charge to the capacitor by providing a positive charging voltage to the capacitor through the series diode.

8. The logic gate of claim 7, wherein the plurality of inputs discharge the capacitor through a plurality of corresponding series input diodes if any of the inputs are at a voltage potential of less than a threshold discharge voltage.

9. The logic gate of claim 1, wherein the charge holding device is a capacitor, and the charging circuit provides a charge to the capacitor by providing a near zero charging voltage to the capacitor through the series diode.

10. The logic gate of claim 7, wherein the plurality of inputs charge the capacitor through a plurality of corresponding series input diodes if any of the inputs are at a voltage potential of greater than a threshold charge voltage.

11. An address decoder comprising:
    a charge holding device;
    a charging circuit for selectively providing a predetermined charge for the charge holding device, the charging circuit comprising an electrically switched connection of a predetermined voltage potential to the charge holding device through a series diode;
    an address decoder output that is a function of charge on the charge holding device; and
    a plurality of address lines, the plurality of address lines being electrically connected to the charge holding device so that the charge of the charge holding device is modified if any of the plurality of address lines is a first voltage potential.

12. The address decoder of claim 11, wherein the charging circuit comprises a charging transistor.

13. The address decoder of claim 12, wherein the charging transistor is located on a first substrate, and the charge holding device and the address decoder output are located on a second substrate.

14. The address decoder of claim 12, wherein a single charging transistor is connected to a plurality of charge holding devices of a plurality of logic gate outputs.

15. The address decoder of claim 11, wherein the charge of the charge holding device is not modified if all of the plurality of address lines are at a second voltage potential.

16. The address decoder of claim 11, wherein the charge holding device comprises a capacitor.

17. The address decoder of claim 11, wherein each of the plurality of inputs is electrically connected to the charge holding device through a corresponding series input diode.

18. A memory array comprising:
    an array of memory cells;
    a plurality of address lines for addressing the memory cells;
    an address decoder for selection of the address lines, the address decoder comprising;
    a charge holding device;
    a charging circuit for selectively providing a predetermined charge for the charge holding device, the charging circuit comprising an electrically switched connection of a predetermined voltage potential to the charge holding device through a series charging diode;

an address decoder output that is a function of charge on the charge holding device; and a plurality of address lines, the plurality of address lines being electrically connected to the charge holding device so that the charge of the charge holding device is modified if any of the plurality of address lines is a first voltage potential.

19. The address decoder of claim 18, wherein the charging circuit comprises a charging transistor.

20. The address decoder of claim 19, wherein the charging transistor is located on a first substrate, and the charge holding device and the address decoder output are located on a second substrate.

21. The address decoder of claim 19, wherein a single charging transistor is connected to a plurality of charge holding devices of a plurality of logic gate outputs.

22. The address decoder of claim 18, wherein the charge of the charge holding device is not modified if all of the plurality of address lines are at a second voltage potential.

23. The address decoder of claim 18, wherein the charge holding device comprises a capacitor.

24. The address decoder of claim 18, wherein each of the plurality of inputs is electrically connected to the charge holding device through a corresponding series input diode.

25. A computing device comprising:

a central processing unit;

a memory array that can be accessed by the central processing unit;

an array of memory cells;

a plurality of address lines for addressing the memory cells;

an address decoder for selection of the address lines, the address decoder comprising;

a charge holding device;

a charging circuit for selectively providing a predetermined charge for the charge holding device, the charging circuit comprising an electrically switched connection of a predetermined voltage potential to the charge holding device through a series diode;

an address decoder output that is a function of charge on the charge holding device; and the plurality of address lines being electrically connected to the charge holding device so that the charge of the charge holding device is modified if any of the plurality of address lines is a first voltage potential.

26. The address decoder of claim 25, wherein the charging circuit comprises a charging transistor.

27. The address decoder of claim 26, wherein the charging transistor is located on a first substrate, and the charge holding device and the address decoder output are located on a second substrate.

28. The address decoder of claim 26, wherein a single charging transistor is connected to a plurality of charge holding devices of a plurality of logic gate outputs.

* * * * *